(12) United States Patent
Rack et al.

(10) Patent No.: US 10,507,491 B2
(45) Date of Patent: Dec. 17, 2019

(54) ROTARY WING AIRCRAFT WITH A STRUCTURAL ARRANGEMENT THAT COMPRISES AN ELECTRICALLY CONDUCTIVE CONNECTION

(71) Applicant: AIRBUS HELICOPTERS DEUTSCHLAND GMBH, Donauworth (DE)

(72) Inventors: Andreas Rack, Burghausen (DE); David Rosplesch, Noerdlingen (DE); Dietrich Jonke, Taufkirchen (DE)

(73) Assignee: AIRBUS HELICOPTERS DEUTSCHLAND GMBH, Donauworth (DE)

( * ) Notice: Subject to any disclaimer, the term of this patent is extended or adjusted under 35 U.S.C. 154(b) by 307 days.

(21) Appl. No.: 15/716,635

(22) Filed: Sep. 27, 2017

(65) Prior Publication Data
US 2018/0085782 A1  Mar. 29, 2018

(30) Foreign Application Priority Data
Sep. 27, 2016 (EP) .................................. 16400043

(51) Int. Cl.
*B64D 45/02* (2006.01)
*B05D 5/12* (2006.01)
(Continued)

(52) U.S. Cl.
CPC .............. *B05D 5/12* (2013.01); *B05D 1/025* (2013.01); *B05D 7/02* (2013.01); *B64C 1/12* (2013.01); *H01R 4/64* (2013.01); *B05D 2201/02* (2013.01); *B32B 5/022* (2013.01); *B64D 45/02* (2013.01); *H01L 41/317* (2013.01)

(58) Field of Classification Search
USPC ....................................................... 361/218
See application file for complete search history.

(56) References Cited

U.S. PATENT DOCUMENTS 4,888,451 A  12/1989  Toni et al.
6,245,696 B1  6/2001  Haas et al.
(Continued)

FOREIGN PATENT DOCUMENTS

WO  2005032812 A2  4/2005

OTHER PUBLICATIONS

European Search Report for French Application No. EP16400043, Completed by the European Patent Office, dated Mar. 8, 2017, 8 pages.

*Primary Examiner* — Danny Nguyen
(74) *Attorney, Agent, or Firm* — Brooks Kushman P.C.

(57) ABSTRACT

A rotary wing aircraft that comprises a structural arrangement with at least one first fiber reinforced polymer component and at least one second fiber reinforced polymer component that are spaced apart from each other by an interspace and that are rigidly attached to an associated structural component, wherein the at least one first fiber reinforced polymer component and the at least one second fiber reinforced polymer component are at least partly interconnected by means of an electrically conductive connection, and wherein the electrically conductive connection comprises at least one sprayed layer of electrically conductive particles, the at least one sprayed layer of electrically conductive particles being provided in the interspace.

13 Claims, 5 Drawing Sheets

(51) Int. Cl.

| | |
|---|---|
| *B05D 1/02* | (2006.01) |
| *B05D 7/02* | (2006.01) |
| *B64C 1/12* | (2006.01) |
| *H01R 4/64* | (2006.01) |
| B32B 5/02 | (2006.01) |
| H01L 41/317 | (2013.01) |

(56) References Cited

U.S. PATENT DOCUMENTS

| | | |
|---|---|---|
| 2005/0213278 A1 | 9/2005 | Hawley |
| 2010/0263898 A1 | 10/2010 | Hebert |
| 2010/0320325 A1 | 12/2010 | Parikh et al. |
| 2011/0297315 A1 | 12/2011 | Kishida et al. |
| 2015/0090836 A1* | 4/2015 | Burgess ................ B64D 45/02 244/1 A |
| 2016/0107739 A1 | 4/2016 | Restuccia et al. |
| 2018/0050817 A1* | 2/2018 | Le .......................... B64D 45/02 |

* cited by examiner

ROTARY WING AIRCRAFT WITH A STRUCTURAL ARRANGEMENT THAT COMPRISES AN ELECTRICALLY CONDUCTIVE CONNECTION

CROSS-REFERENCE TO RELATED APPLICATIONS

This application claims priority to European patent application No. EP 16400043.2 filed on Sep. 27, 2016, the disclosure of which is incorporated in its entirety by reference herein.

BACKGROUND OF THE INVENTION

(1) Field of the Invention

The invention is related to a structural arrangement with at least one first fiber reinforced polymer component and at least one second fiber reinforced polymer component that are spaced apart from each other by an interspace and that are rigidly attached to an associated structural component, wherein the at least one first fiber reinforced polymer component and the at least one second fiber reinforced polymer component are at least partly interconnected by means of an electrically conductive connection. The invention is further related to a method of manufacturing such a structural arrangement, as well as to a rotary wing aircraft that comprises such a structural arrangement.

(2) Description of Related Art

Currently, an ever increasing number of rotary wing aircrafts is authorized to fly under Instrument Flight Rules (IFR) in all type of weather conditions, so that operating environments of such rotary wing aircrafts and, consequently, an underlying design philosophy have significantly changed. This particularly applies to respective structural arrangements, especially aircraft airframes respectively fuselages, of the rotary wing aircrafts, which are more and more implemented by means of fiber reinforced polymer components, e.g. fiber reinforced polymer panels.

However, such fiber reinforced polymer components have an electrical behavior, in particular with respect to lightning strikes, that significantly differs from a respective electrical behavior of e.g. Aluminum structural arrangements, which were formerly mainly used in implementing aircraft structural arrangements. As a result of this different electrical behavior, a respective possibility of a lightning strike of a given rotary wing aircraft has increased.

As it is well-known, such a lightning strike may have serious consequences. Such consequences are roughly divided into two different categories: lightning direct effects (LDEs) and lightning indirect effects (LIEs).

More specifically, LDEs refer to damages that include burning, eroding, blasting and structural deformation produced by high electrical currents resulting from a lightning flash that passes through a structural arrangement of a given rotary wing aircraft. LIEs in turn refer to perturbations, failures, damages of equipment, including ignitions, which result from a respective electrical transient that is generated by a lightning flash and that leads to an electromagnetic coupling with electrical and/or electronical equipment of a given rotary wing aircraft.

In summary, as rotary wing aircrafts that are mainly implemented by means of fiber reinforced polymer components, e.g. fiber reinforced polymer panels, are comparatively more prone to lightning strikes, they must be provided with a suitable protection against LDEs and LIEs. For instance, as such fiber reinforced polymer components, e.g. carbon fiber reinforced polymer components, have a higher electrical resistance than comparable Aluminum components, a proper metallization for electrical bonding and grounding is necessary. Furthermore, with respect to LIEs such fiber reinforced polymer components must be electrically connected to each other at a predefined distance depending on the installed equipment with a maximum resistance of e.g. 1 mΩ.

Conventionally, an electrical connection of fiber reinforced polymer components is performed by means of copper splices that are mounted to the fiber reinforced polymer components by means of an electrically conductive adhesive and riveting. This is either performed directly on top of the fiber reinforced polymer components, or in respective recesses provided thereon. By way of example, such electrical connections are described in the documents US 2010/0320325 A1, US 2005/0213278 A1, and WO 2005/032812 A2.

For instance, the document U.S. Pat. No. 4,888,451 describes a composite joint having electrical continuity for lightning protection in aircrafts. The composite joints have a conductive bridge layer disposed in the mechanical interface of the joint. The conductive bridge layer is in contact with the conductive layers attached to composite panels. In an overlap joint, a first composite panel and a second composite panel have each an exterior surface having a conductive layer thereon. The conductive layer does not wrap around the joint end of the panel because of trimming requirements. The conductive layer is applied during layup of the composite to provide electrical continuity from the conductive layer of the first panel to the conductive layer of the second panel.

However, such conventionally realized electrical connections are usually comparatively costly, e.g. due to a required provision of respective recesses and/or additionally required components. They may also be disadvantageous regarding an undesired increase of a respective aerodynamic resistance of outer surfaces of aircraft structural arrangements.

The document U.S. Pat. No. 6,245,696 describes an electronic substrate in the form of a bond-ply material manufactured by impregnating a layer of nonwoven reinforced resin core that is sandwiched between two B-stage resin layers. The nonwoven reinforced resin core provides dimensional stability and ensures a well defined thickness between two adjacent circuit layers. The nonwoven reinforced resin core is prepared by impregnating a nonwoven reinforcement material with a resin and curing the resin. Thus nonwoven reinforced resin core has a first surface and a second surface.

The document US2016107739 describes a ready for molding and curing prepreg to be used in manufacturing composite load-bearing structural parts of aircrafts. The composite load-bearing structural parts have increased electrically conductivity as required to satisfy stringent requirements for lightning strike protection. In that purpose, conductive composite particles are incorporated in the composite load-bearing structural parts. The conductive composite particles are dispersed in interlaminar regions formed between curable, composite layers. Upon curing, a polymeric component of the conductive composite particles undergoes phase transition to a fluid phase, and dissolves in the resin matrix of the composite layers.

The document US2010263898 describes a lightning protection sheet which includes an electrically conductive film patterned into a plurality of hill features, for use on an outer surface of an aircraft structure.

The document US2011297315 describes resin-based composite having conductivity. The resin-based composite has a structure in which a first resin sheet, a conductive layer that acts as a lightning-resistant layer, and a second resin sheet which are laminated in sequence.

BRIEF SUMMARY OF THE INVENTION

It is, therefore, an object of the present invention to provide a new rotary wing aircraft with a structural arrangement that comprises at least one first fiber reinforced polymer component and at least one second fiber reinforced polymer component with at least one improved electrical connection between the first and second fiber reinforced polymer components. It is a further object of the present invention to provide a method of manufacturing such a structural arrangement and it is, moreover, an object of the present invention to provide such a structural arrangement as such. This object is solved by a structural arrangement with at least one first fiber reinforced polymer component and at least one second fiber reinforced polymer component, the structural arrangement comprising the features of claim 1.

More specifically, according to the present invention the structural arrangement comprises at least one first fiber reinforced polymer component and at least one second fiber reinforced polymer component that are spaced apart from each other by an interspace and that are rigidly attached to an associated structural component. The at least one first fiber reinforced polymer component and the at least one second fiber reinforced polymer component are at least partly interconnected by means of an electrically conductive connection. The electrically conductive connection comprises at least one sprayed layer of electrically conductive particles that is provided in the interspace.

According to one aspect, the at least one first and second fiber reinforced polymer components are preferably attached to structural elements of an aircraft, in particular a rotary wing aircraft, such as e.g. T-shaped stringers, ribs, beams etc. However, between the fiber reinforced polymer components that are attached to such structural elements, usually an interspace or gap is formed, which leads to an undesired and disadvantageous, comparatively high electrical resistance, which must at least be reduced and, preferably, be avoided. Even if each one of the at least one first and second fiber reinforced polymer components is provided with a respective electrically conductive foil at its selvage and an electrically conductive metal mesh on its outer surface, which is preferably made of copper, the interspace or gap that conventionally amounts to approximately 1 mm to 10 mm interrupts an underlying electrical conductivity between the fiber reinforced polymer components and leads to a comparatively high electrical resistance between them.

Therefore, fiber reinforced polymer components of structural arrangements, e.g. fiber reinforced polymer components that are used for constructing aircraft structural arrangements, especially in rotary wing aircrafts, or structural arrangements of other vehicles or machines, are according to one aspect at least partly electrically connected to each other by using a thermal gas spray technology. Preferably, each fiber reinforced polymer component therein is provided with a thin metal foil at its selvage and thin metal foils provided at selvages of adjacent fiber reinforced polymer components are electrically connected to each other. Thereby, a small slot between the thin metal foils may be created, which may lead to a reduced electrical current flow capacity between the thin metal foils and, thus, the respective adjacent fiber reinforced polymer components. Consequently, by building up a metal bridging layer respectively bridging layers at the location of the small slot between the thin metal foils by means of the thermal spray or thermal gas spray technology, at least an improved electrical connection of the thin metal foils can be achieved.

Advantageously, by using the thermal gas spray technology, at least an improved and preferably a high and constant quality electrical connection of thin metal foils provided at adjacent fiber reinforced polymer components can be achieved. Therein, the thermal gas spray technology is preferentially implemented by means of an automated process. Thus, a significant cost reduction and important time savings can be realized, while generally obtaining a smooth outer surface of electrically connected fiber reinforced polymer components.

More specifically, the thermal gas spray technology and, in particular, a cold gas or metal gas spray technology, is applied for finishing an electrically conductive connection between two adjacently mounted fiber reinforced polymer components in order to provide for a comparatively low electrical resistance of preferentially less than 1 mΩ between these two adjacently mounted fiber reinforced polymer components.

According to a preferred embodiment, the at least one sprayed layer of electrically conductive particles fills the interspace at least partly.

According to a further preferred embodiment, the at least one first fiber reinforced polymer component is electro-conductively connected to a first electrically conductive foil and the at least one second fiber reinforced polymer component is electro-conductively connected to a second electrically conductive foil. The at least one sprayed layer of electrically conductive particles is at least partly formed between the first and second electrically conductive foils.

According to a further preferred embodiment, the first and second electrically conductive foils are separated in the interspace by at least one slot, the at least one sprayed layer of electrically conductive particles being provided for bridging the at least one slot.

According to a further preferred embodiment, the first electrically conductive foil is at least approximately L-, C- or Z-shaped.

According to a further preferred embodiment, the second electrically conductive foil is at least approximately L- or C-shaped.

According to a further preferred embodiment, the associated structural component is connected to a third electrically conductive foil, the third electrically conductive foil being electro-conductively connected to the first electrically conductive foil and the second electrically conductive foil.

According to a further preferred embodiment, the third electrically conductive foil is at least approximately plate-shaped.

According to a further preferred embodiment, the electrically conductive connection exhibits an electrical resistance of less than 1 mΩ between the first electrically conductive foil and the second electrically conductive foil.

According to a further preferred embodiment, the at least one first fiber reinforced polymer component and the at least one second fiber reinforced polymer component are rigidly attached to the associated structural component by means of associated fixation means that comprise at least one of screws, rivets, bolts and structural bonding.

According to a further preferred embodiment, the associated structural component is one of a joggled panel, shell, stringer, rib, frame and beam of a rotary wing aircraft and the at least one first fiber reinforced polymer component and the at least one second fiber reinforced polymer component are implemented as panels or shells of the rotary wing aircraft, wherein the interspace exhibits a width that is comprised in a range between 1 mm and 10 mm.

The present invention further provides a method of manufacturing a structural arrangement from at least one first fiber reinforced polymer component, at least one second fiber reinforced polymer component and an associated structural component. The method comprises:

providing the at least one first fiber reinforced polymer component at least partly with a first electrically conductive foil and the at least one second fiber reinforced polymer component at least partly with a second electrically conductive foil;

rigidly attaching the at least one first fiber reinforced polymer component and the at least one second fiber reinforced polymer component to the associated structural component, wherein an interspace is created that spaces the at least one first fiber reinforced polymer component and the at least one second fiber reinforced polymer component apart from each other, wherein a slot is at least partly created between the first electrically conductive foil and the second electrically conductive foil; and spraying electrically conductive particles in the interspace onto the slot for creating a sprayed layer of electrically conductive particles, the at least one sprayed layer of electrically conductive particles being provided for electroconductively interconnecting at least partly the first electrically conductive foil and the second electrically conductive foil.

According to a preferred embodiment, spraying of the electrically conductive particles is performed by means of a thermal spray technology.

According to a further preferred embodiment, the thermal spray technology comprises a cold gas spray method.

The present invention further provides a rotary wing aircraft with a structural arrangement as described above.

BRIEF DESCRIPTION OF THE DRAWINGS

Preferred embodiments of the invention are outlined by way of example in the following description with reference to the attached drawings. In these attached drawings, identical or identically functioning components and elements are labelled with identical reference numbers and characters and are, consequently, only described once in the following description.

DETAILED DESCRIPTION OF THE INVENTION

Figure 1:
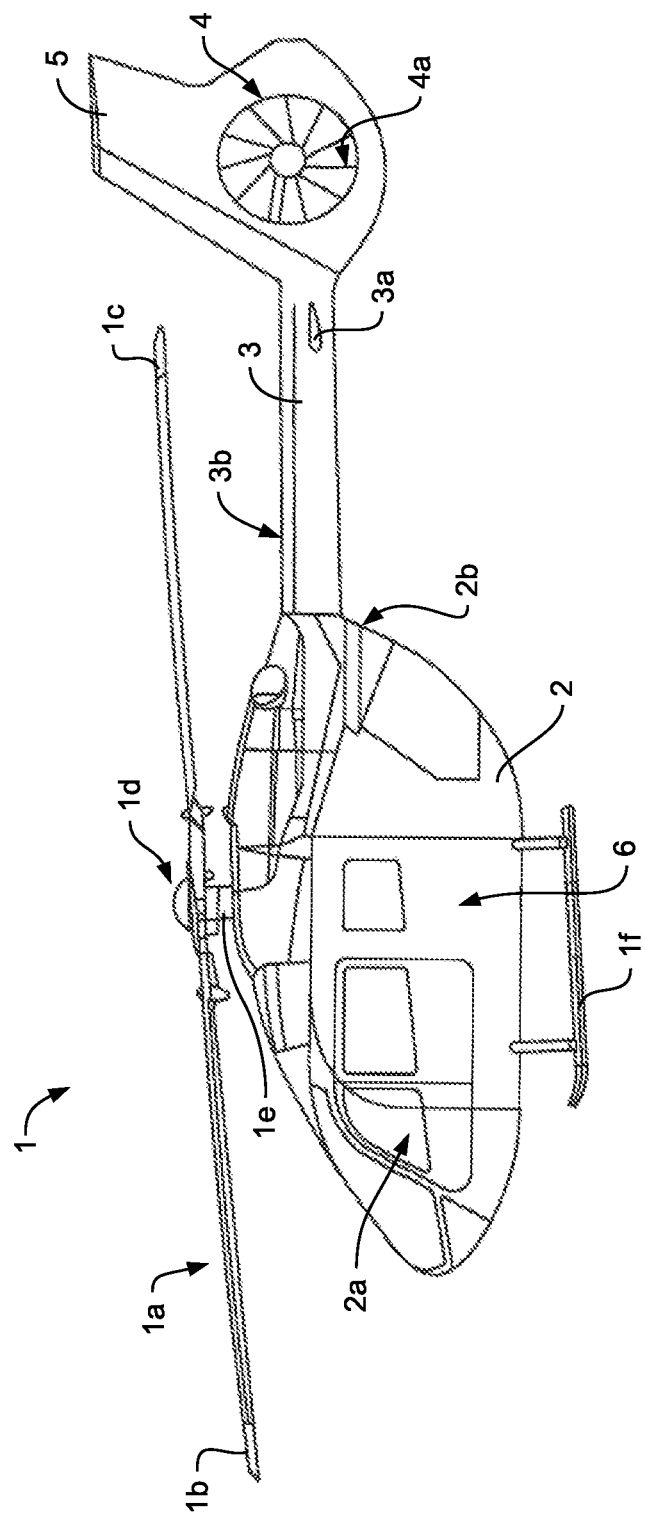
FIG. 1 shows a lateral view of a helicopter with a fuselage that comprises a structural arrangement according to the invention.

FIG. 1 shows an aircraft 1 that is exemplarily illustrated as a rotary wing aircraft and, more particularly, as a helicopter. Thus, for purposes of simplicity and clarity, the aircraft 1 is hereinafter referred to as the "helicopter" 1.

Illustratively, the helicopter 1 comprises a fuselage 2 that is connected to a landing gear 1f and defines a cabin 2a and a rear fuselage 2b. The rear fuselage 2b is connected to a tail boom 3.

Figure 2:
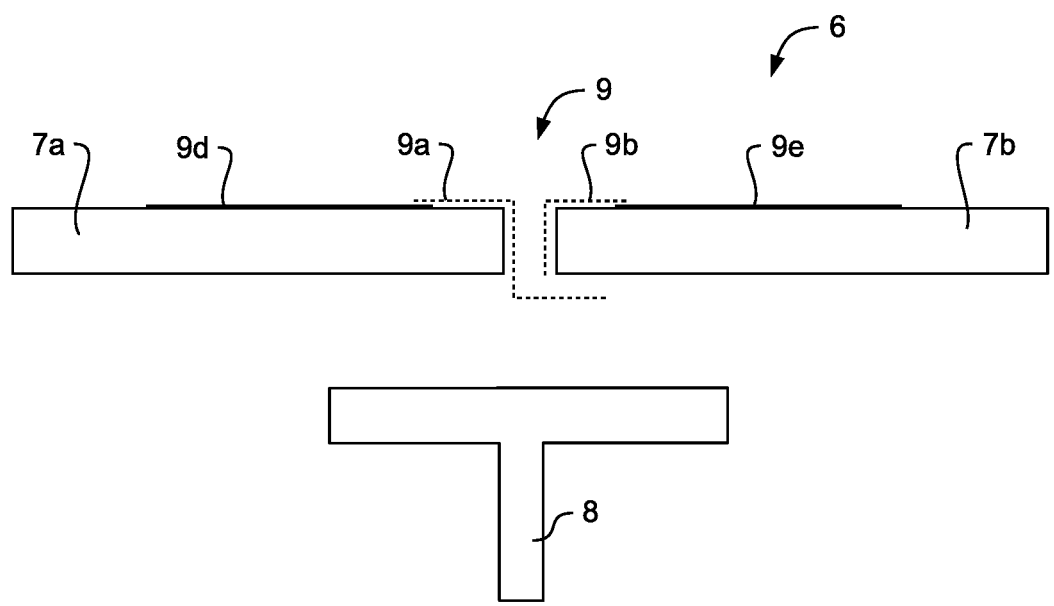
FIG. 2 to FIG. 4 illustrate a method of manufacturing a structural arrangement according to one aspect.

According to one aspect, the fuselage 2 comprises at least one structural arrangement 6, or embodies the structural arrangement 6, which is preferably implemented using at least two fiber reinforced polymer components (7a, 7b in FIG. 2). The structural arrangement 6 is exemplarily and representatively described in detail below with respect to FIG. 2 to FIG. 8.

Illustratively, the helicopter 1 further comprises at least one multi-blade main rotor 1a for providing lift and forward or backward thrust during operation. The at least one multi-blade main rotor 1a comprises a plurality of rotor blades 1b, 1c that are mounted at an associated rotor head 1d to a rotor shaft 1e, which rotates in operation of the helicopter 1 around an associated rotor axis.

By way of example, the helicopter 1 further comprises at least one preferentially shrouded counter-torque device 4 configured to provide counter-torque during operation, i.e. to counter the torque created by rotation of the at least one multi-blade main rotor 1a for purposes of balancing the helicopter 1 in terms of yaw. The at least one counter-torque device 4 is illustratively provided at an aft section of the tail boom 3 and preferably comprises a tail rotor 4a. The aft section of the tail boom 3 preferably further comprises a vertical stabilizer 5. Illustratively, the tail boom 3 is also provided with a suitable horizontal stabilizer 3a.

Preferably, the tail boom 3 is a composite tail boom, i.e. a tail boom that comprises composite material and that is preferably at least essentially manufactured from composite material, preferentially fiber reinforced polymer material. Illustratively, the composite tail boom 3 is preferably implemented as a slim beam element that comprises at least partly a tail boom cone 3b, which is preferably tubular. In other words, the composite tail boom 3 is preferentially a closed structure with a nearly circular cross section.

Figure 3:
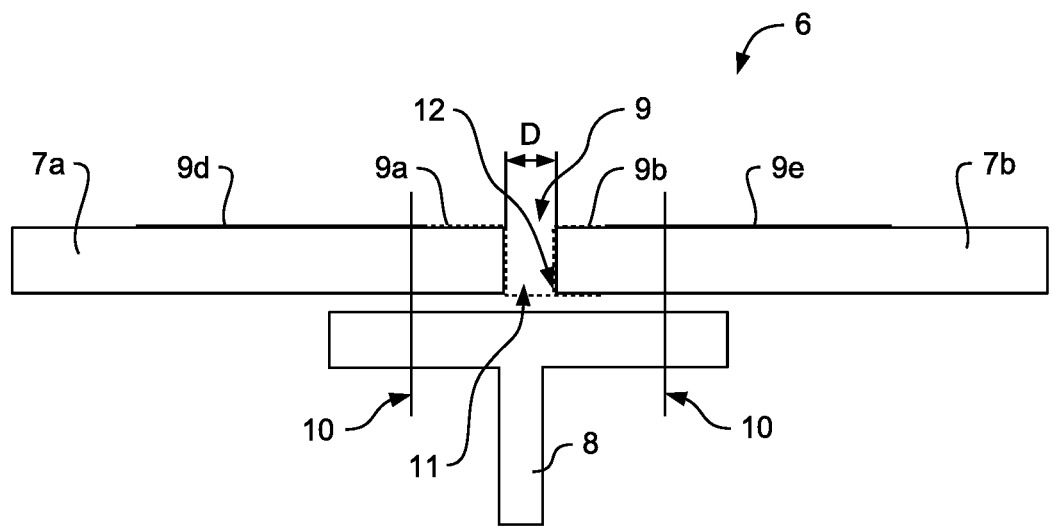
Figure 4:
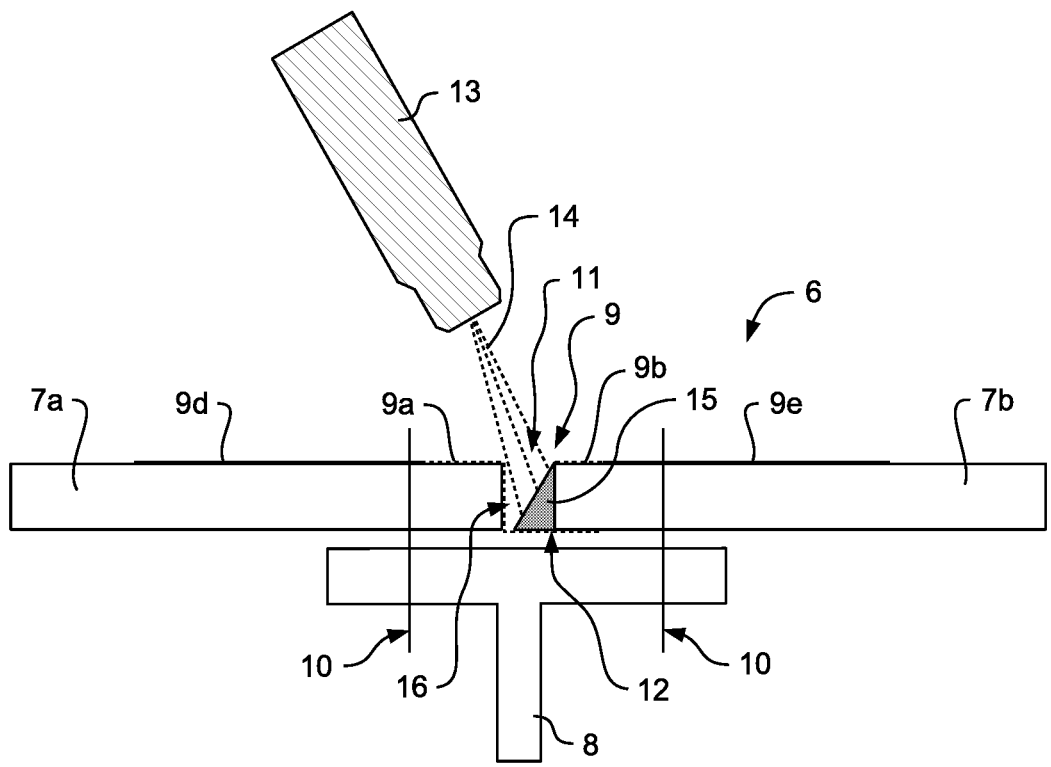

FIG. 2 shows the structural arrangement 6 of FIG. 1, which is implemented according to a first aspect. In connection with FIG. 3 and FIG. 4, FIG. 2 illustrates an exemplary method of manufacturing the structural arrangement 6.

The structural arrangement 6 preferably comprises at least one first fiber reinforced polymer component 7a and at least one second fiber reinforced polymer component 7b, which are preferentially implemented as panels or shells of the helicopter 1 of FIG. 1. The at least one first fiber reinforced polymer component 7a and the at least one second fiber reinforced polymer component 7b are preferably produced by means of a standard procedure in a preliminary process step, which includes lamination of metal meshes, preferably copper meshes 9d, 9e, on respective—in FIG. 2 upper— surfaces of the at least one first fiber reinforced polymer component 7a and the at least one second fiber reinforced polymer component 7b.

The at least one first fiber reinforced polymer component 7a and the at least one second fiber reinforced polymer component 7b preferably comprise carbon fiber reinforced polymers, but may alternatively comprise also other kinds of reinforcement fibers, such as glass, aramid and so on. However, the present invention is not limited to such fiber reinforced polymer components, but more generally likewise applies to any other nonconductive material. Thus, in the context of the present invention the term "fiber reinforced polymer component" is construed for designating any component of nonconductive material, comprising components made of fiber reinforced polymers.

According to one aspect, the at least one first fiber reinforced polymer component 7a is electro-conductively connected to a first electrically conductive foil 9a and the at least one second fiber reinforced polymer component 7b is electro-conductively connected to a second electrically conductive foil 9b. The first and second electrically conductive foils 9a, 9b are preferably metal foils and, preferentially, copper foils. They are provided for partly interconnecting the at least one first fiber reinforced polymer component 7a and the at least one second fiber reinforced polymer component 7b and, thus, creating an electrically conductive connection 9 there between.

Preferably, the first electrically conductive foil 9a is at least approximately Z-shaped, i.e. illustratively comprises two kinks in cross section. The second electrically conductive foil 9b is preferentially at least approximately L- or C-shaped, i.e. illustratively comprises not more than a single kink. According to one aspect, the first and second electrically conductive foils 9a, 9b are laminated into the at least one first fiber reinforced polymer component 7a and the at least one second fiber reinforced polymer component 7b, respectively, at associated locations resp. edges. This is preferentially accomplished during the preliminary process step.

In a parallel process step, one or more structural components resp. connecting surfaces of such structural components for attaching the at least one first fiber reinforced polymer component 7a and the at least one second fiber reinforced polymer component 7b can be prepared. Such a preparation may include bonding of a metallic foil, preferably a copper foil (9c in FIG. 7), on respective intended attachment areas, or directly laminating the metallic foil onto the respective connection surfaces of the one or more structural components, if they are made of fiber reinforced polymers.

By way of example, an associated structural component 8 is prepared, which is illustratively implemented as a T-shaped stringer of the helicopter 1 of FIG. 1. However, other structural components, in particular structural components of the helicopter 1 of FIG. 1, are likewise contemplated, such as e.g. joggled panels, shells, ribs, frames and beams.

FIG. 3 shows the structural arrangement 6 of FIG. 2 with the at least one first fiber reinforced polymer component 7a, the at least one second fiber reinforced polymer component 7b and the associated structural component 8. The at least one first fiber reinforced polymer component 7a comprises the Z-shaped first electrically conductive foil 9a and the at least one second fiber reinforced polymer component 7b comprises the L- or C-shaped second electrically conductive foil 9b.

According to one aspect, the at least one first fiber reinforced polymer component 7a and the at least one second fiber reinforced polymer component 7b are spaced apart from each other by an interspace 11 and rigidly attached to the associated structural component 8 in an associated assembling process step. The interspace 11 exhibits a width D that is preferentially comprised in a range between 1 mm and 10 mm. The rigid attachment is preferably performed by means of associated fixation means 10 that comprise at least one of screws, rivets, bolts and structural bonding.

Illustratively, the at least one first fiber reinforced polymer component 7a and the at least one second fiber reinforced polymer component 7b are rigidly attached to the associated structural component 8 such that at least a portion of the Z-shaped first electrically conductive foil 9a is arranged between the at least one second fiber reinforced polymer component 7b and the associated structural component 8. However, as a result of this rigid attachment, the Z-shaped first and L- or C-shaped second electrically conductive foils 9a, 9b may at least partly be separated in the interspace 11 by at least one slot or recess 12. This at least one slot or recess 12, however, interrupts an underlying electrical conductivity between the Z-shaped first and L- or C-shaped second electrically conductive foils 9a, 9b.

FIG. 4 shows the structural arrangement 6 of FIG. 3 with the at least one first fiber reinforced polymer component 7a and the at least one second fiber reinforced polymer component 7b, which are rigidly attached to the associated structural component 8. The at least one first fiber reinforced polymer component 7a comprises the Z-shaped first electrically conductive foil 9a and the at least one second fiber reinforced polymer component 7b comprises the L- or C-shaped second electrically conductive foil 9b, which are provided for creating the electrically conductive connection 9 and which are at least partly separated in the interspace 11 by the at least one slot or recess 12.

According to one aspect, the at least one slot or recess 12 is bridged in an associated bridging process step such that the electrically conductive connection 9 exhibits an electrical resistance of less than 1 mΩ between the Z-shaped first electrically conductive foil 9a and the L- or C-shaped second electrically conductive foil 9b. During this associated bridging process step, preferably at least one sprayed layer 15 of electrically conductive particles 14 is provided, i.e. created in the interspace 11 for bridging the at least one slot or recess 12. Preferentially, the at least one sprayed layer 15 of electrically conductive particles 14 is at least partly formed between the Z-shaped first electrically conductive foil 9a and the L- or C-shaped second electrically conductive foil 9b.

According to one aspect, the at least one sprayed layer 15 of electrically conductive particles 14 is created resp. formed by spraying, in particular thermal spraying of the electrically conductive particles 14 onto the at least one slot or recess 12 by means of a thermal spray technology using a suitable spraying tool 13. Preferentially, the thermal spray technology is realized as a metal gas or cold gas spray method.

The thermal spraying is preferably done by a robot in an automatized process for series production, while repairing of the electrically conductive connection 9 and, more specifically, the at least one sprayed layer 15 could be done manually. This guaranties low production costs and a high quality of the at least one sprayed layer 15.

However, it should be noted that the thermal spraying is not limited to the above described metal gas or cold gas spray method which is one of many different thermal spray methods that can likewise be applied. It should further be noted that thermal spraying, i.e. the thermal spray technology, as such is not part of the present invention and well-known to the person skilled in the art and, therefore, not described in more detail hereinafter.

Preferably, the at least one sprayed layer 15 of electrically conductive particles 14 fills the interspace 11 at least partly. Illustratively, but not necessarily, the at least one sprayed layer 15 leaves a remaining empty interspace 16 in the interspace 11. This remaining empty interspace 16 is preferably filled with a corrosion resistant filler material to smoothen out an outer—in FIG. 4 upper—surface of the structural arrangement 6, e.g. prior to a final painting process step thereof.

In summary, FIG. 4 shows the structural arrangement 6 after manufacturing thereof with the at least one first fiber reinforced polymer component 7a and the at least one second fiber reinforced polymer component 7b that are spaced apart from each other by the interspace 11 and that are rigidly attached to the associated structural component 8, wherein the at least one first fiber reinforced polymer component 7a and the at least one second fiber reinforced polymer component 7b are at least partly interconnected by means of the electrically conductive connection 9, which comprises the at least one sprayed layer 15 of electrically conductive particles 14. As described above, the at least one sprayed layer 15 of electrically conductive particles 14 is provided in the interspace 11.

Figure 5:
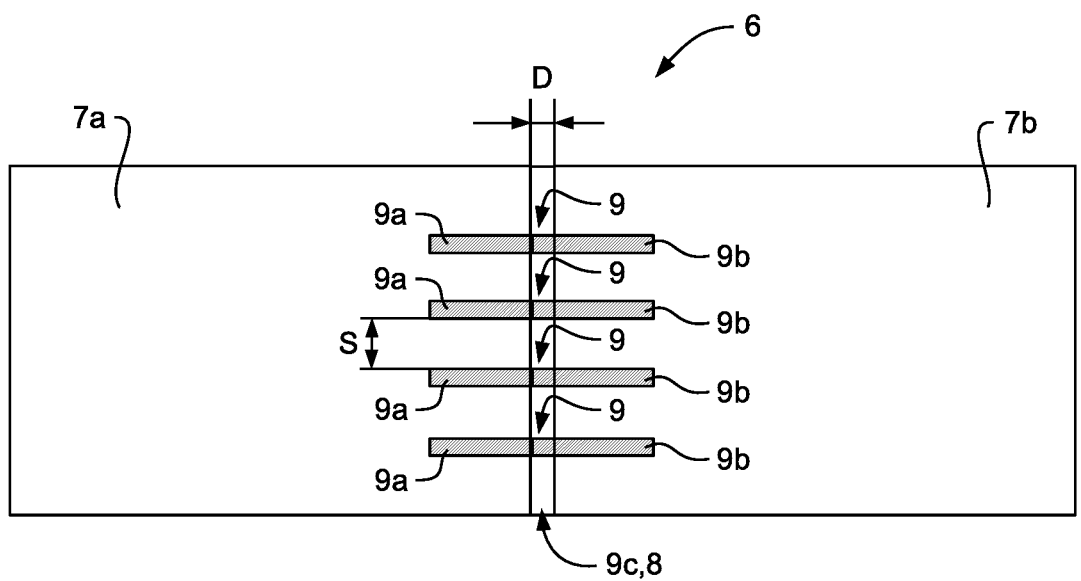
FIG. 5 shows a top view of a structural arrangement that is manufactured according to FIG. 2 to FIG. 4, and FIG. 6 to FIG. 8 show alternative structural arrangements.

FIG. 5 shows the structural arrangement 6 of FIG. 4, which exemplarily comprises a plurality of electrically conductive connections 9. Illustratively, four electrically conductive connections 9 are provided, wherein adjacent ones thereof are preferably spaced apart from each other by an associated spacing S that is defined according to a necessary protection for respectively installed equipment.

However, it should be noted that the structural arrangement 6 is represented in a simplified manner in FIG. 5 for simplicity and clarity of the drawings. For instance, the electrically conductive surfaces 9d, 9e of FIG. 4 are not shown, and so on.

Figure 6:
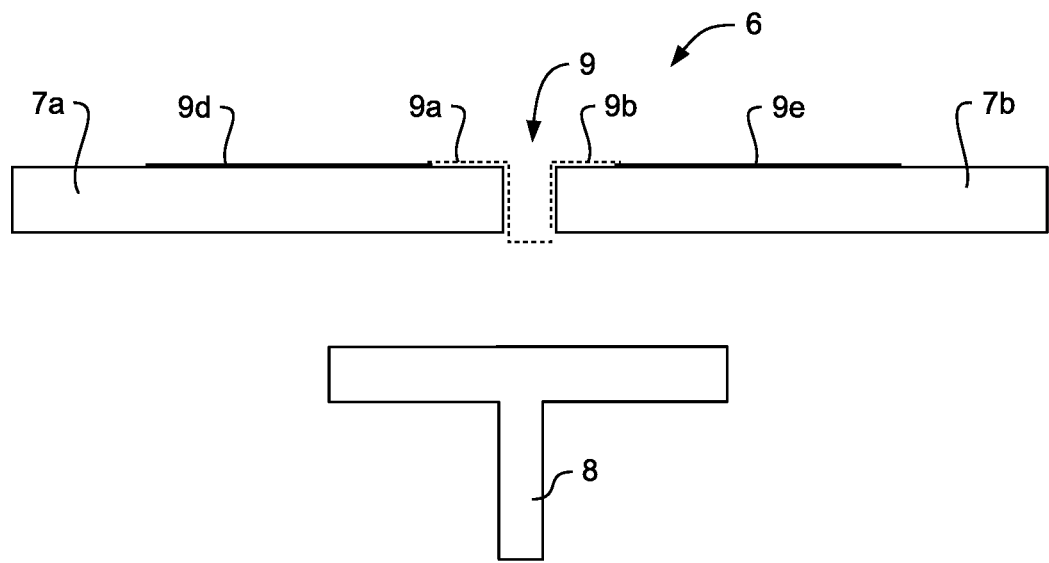

FIG. 6 shows the structural arrangement 6 of FIG. 2 in the preliminary process step according to FIG. 2. However, in contrast to FIG. 2, the Z-shaped first electrically conductive foil 9a is now shorter such that it cannot be arranged at least partly between the at least one second fiber reinforced polymer component 7b and the associated structural component 8 of FIG. 2.

Figure 7:
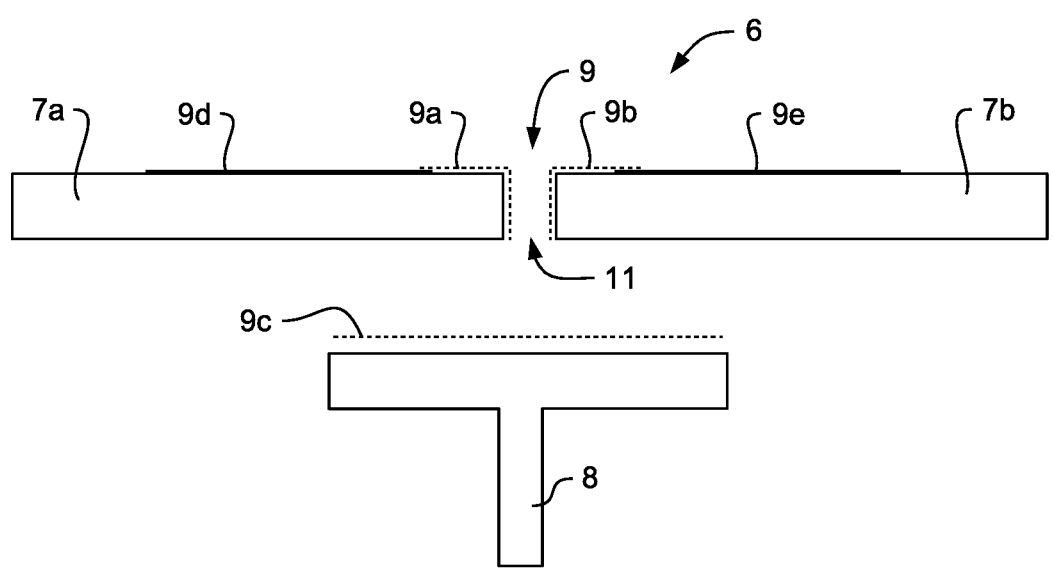

FIG. 7 shows the structural arrangement 6 of FIG. 2 in the preliminary process step according to FIG. 2. However, in contrast to FIG. 2, the first electrically conductive foil 9a is now also L- or C-shaped. In this case, the associated structural component 8 of FIG. 2 is preferably provided with a third electrically conductive foil 9c that is preferentially electro-conductively connected to the L- or C-shaped first and second electrically conductive foils 9a, 9b. According to one aspect, the third electrically conductive foil 9c is at least approximately plate-shaped and implemented by means of a metal foil, preferably a copper foil.

However, it should be noted that in this case at least two recesses or slots are created in the interspace 11, one between the L- or C-shaped first electrically conductive foil 9a and the plate-shaped third electrically conductive foil 9c, and another one between the L- or C-shaped second electrically conductive foil 9b and the plate-shaped third electrically conductive foil 9c. Consequently, at least two sprayed layers according to the sprayed layer 15 of FIG. 4 must be created.

Figure 8:
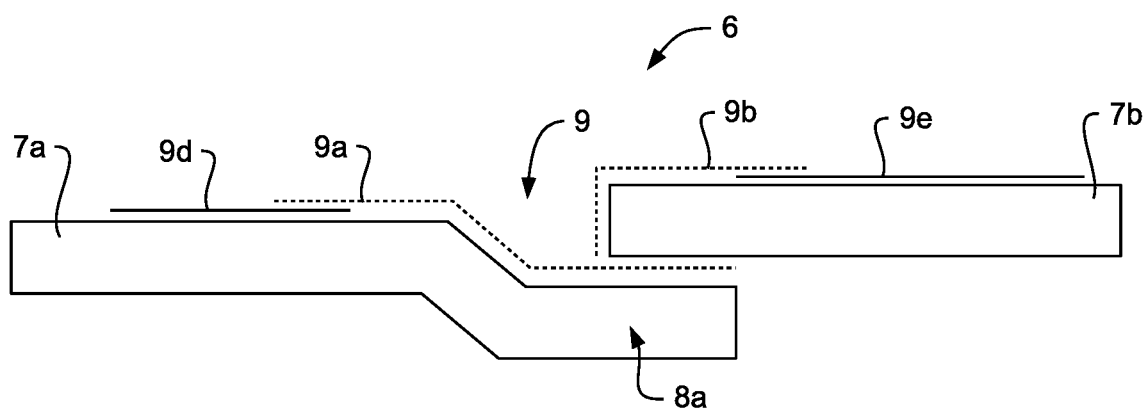

FIG. 8 shows the structural arrangement 6 of FIG. 2 in the preliminary process step according to FIG. 2. However, in contrast to FIG. 2, the at least one first fiber reinforced polymer component 7a is now also Z-shaped and comprises an extension 8a that is at least partly arranged—in FIG. 8 below—the at least one second fiber reinforced polymer component 7b.

It should be noted that modifications to the above described embodiments are within the common knowledge of the person skilled in the art and, thus, also considered as being part of the present invention. For instance, the at least one first fiber reinforced polymer component 7a according to FIG. 6 or FIG. 7 may be provided with the extension of FIG. 8, and so on.

REFERENCE LIST 1 rotary wing aircraft
1a multi-blade main rotor
1b, 1c rotor blades
1d rotor head
1e rotor shaft
1f landing gear
2 fuselage
2a cabin
2b rear fuselage
3 tail boom
3a horizontal stabilizer
3b tail boom cone
4 counter-torque device
4a tail rotor
5 vertical stabilizer
6 structural arrangement
7a, 7b nonconductive material
8 aircraft structural component
8a material extension
9 electrically conductive connection
9a electrically conductive L- or Z-shaped foil
9b electrically conductive L- or C-shaped foil
9c electrically conductive plate-shaped foil
9d, 9e electrically conductive surfaces
10 fixation means
11 fiber reinforced polymer component interspace
12 slot between conductive materials
13 spraying tool
14 electrically conductive particles
15 sprayed layer of electrically conductive particles
16 remaining empty interspace
D fiber reinforced polymer component interspace width
S electrically conductive foil spacing

What is claimed is:

1. A structural arrangement with at least one first fiber reinforced polymer component and at least one second fiber reinforced polymer component that are spaced apart from each other by an interspace and that are rigidly attached to an associated structural component, wherein the at least one first fiber reinforced polymer component and the at least one second fiber reinforced polymer component are at least partly interconnected by means of an electrically conductive connection,
   wherein the electrically conductive connection comprises at least one sprayed layer formed by spraying of electrically conductive particles, the at least one sprayed layer of electrically conductive particles being provided in the interspace, the at least one first fiber reinforced polymer component is electro-conductively connected to a first electrically conductive foil and the at least one second fiber reinforced polymer component is electro-conductively connected to a second electrically conductive foil, the at least one sprayed layer of electrically conductive particles being at least partly formed between the first and second electrically conductive foils and the associated structural component being one of a joggled panel, shell, stringer, rib, frame and beam of a rotary wing aircraft and that the at least one first fiber reinforced polymer component and the at least one second fiber reinforced polymer component being implemented as panels or shells of the rotary wing aircraft, with the interspace exhibiting a width that is comprised in a range between 1 mm and 10 mm.

2. The structural arrangement of claim 1, wherein the at least one sprayed layer of electrically conductive particles fills the interspace at least partly.

3. The structural arrangement of claim 1,
wherein the first and second electrically conductive foils are separated in the interspace by at least one slot, the at least one sprayed layer of electrically conductive particles being provided for bridging the at least one slot.

4. The structural arrangement of claim 3,
wherein the first electrically conductive foil is at least approximately L-, C- or Z-shaped.

5. The structural arrangement of claim 1, wherein the second electrically conductive foil is at least approximately L- or C-shaped.

6. The structural arrangement of claim 1, wherein the associated structural component is connected to a third electrically conductive foil, the third electrically conductive foil being electro-conductively connected to the first electrically conductive foil and the second electrically conductive foil.

7. The structural arrangement of claim 6,
wherein the third electrically conductive foil is at least approximately plate-shaped.

8. The structural arrangement of claim 1,
wherein the electrically conductive connection exhibits an electrical resistance of less than 1 mΩ between the first electrically conductive foil and the second electrically conductive foil.

9. The structural arrangement of claim 1,
wherein the at least one first fiber reinforced polymer component and the at least one second fiber reinforced polymer component are rigidly attached to the associated structural component by means of associated fixation means that comprise at least one of screws, rivets, bolts and structural bonding.

10. A method of manufacturing a structural arrangement from at least one first fiber reinforced polymer component, at least one second fiber reinforced polymer component and an associated structural component, the method comprising:
providing the at least one first fiber reinforced polymer component at least partly with a first electrically conductive foil and the at least one second fiber reinforced polymer component at least partly with a second electrically conductive foil;
rigidly attaching the at least one first fiber reinforced polymer component and the at least one second fiber reinforced polymer component to the associated structural component, wherein an interspace is created that spaces the at least one first fiber reinforced polymer component and the at least one second fiber reinforced polymer component apart from each other, wherein a slot is at least partly created between the first electrically conductive foil and the second electrically conductive foil; and
spraying electrically conductive particles in the interspace onto the slot for creating a sprayed layer of electrically conductive particles, the at least one sprayed layer of electrically conductive particles being provided for electro-conductively interconnecting at least partly the first electrically conductive foil and the second electrically conductive foil.

11. The method of claim 10,
wherein spraying of the electrically conductive particles is performed by means of a thermal spray technology.

12. The method of claim 11,
wherein the thermal spray technology comprises a cold gas spray method.

13. A rotary wing aircraft with a structural arrangement according to claim 1.

* * * * *